United States Patent
Hosseini

(10) Patent No.: US 7,632,718 B2
(45) Date of Patent: Dec. 15, 2009

(54) SEMICONDUCTOR POWER COMPONENT WITH A VERTICAL CURRENT PATH THROUGH A SEMICONDUCTOR POWER CHIP

(75) Inventor: Khalil Hosseini, Weihmichl (DE)

(73) Assignee: Infineon Technologies AG, Neubiberg (DE)

( * ) Notice: Subject to any disclaimer, the term of this patent is extended or adjusted under 35 U.S.C. 154(b) by 575 days.

(21) Appl. No.: 11/504,783

(22) Filed: Aug. 16, 2006

(65) Prior Publication Data
US 2007/0040252 A1    Feb. 22, 2007

(30) Foreign Application Priority Data
Aug. 17, 2005    (DE)   ............... 10 2005 039 165

(51) Int. Cl.
*H01L 21/00*    (2006.01)

(52) U.S. Cl. ............... 438/123; 438/464; 438/773; 257/328; 257/E29.118; 257/E29.198; 257/E29.257; 257/E23.031; 257/E21.238; 257/E23.037; 257/724; 257/177; 257/182; 257/692; 257/666; 257/690; 257/691; 257/693

(58) Field of Classification Search ............... 438/464, 438/773, 123; 257/328, E29.118, E29.198, 257/60, E29.257, E23.031, E21.238, 676, 257/E23, E23.037, 724, 177, 182, 666, 690–693
See application file for complete search history.

(56) References Cited

U.S. PATENT DOCUMENTS

| 4,530,152 A | * | 7/1985 | Roche et al. | ............ 29/856 |
| 4,546,374 A | * | 10/1985 | Olsen et al. | ............ 257/772 |
| 5,110,034 A | * | 5/1992 | Simmonds | ............ 228/179.1 |
| 5,117,275 A | * | 5/1992 | Bregman et al. | ............ 257/776 |
| 5,294,897 A | * | 3/1994 | Notani et al. | ............ 333/33 |
| 5,338,900 A | * | 8/1994 | Schneider et al. | ............ 174/250 |
| 5,398,863 A | * | 3/1995 | Grube et al. | ............ 228/106 |
| 5,463,242 A | * | 10/1995 | Castleberry | ............ 257/448 |
| 5,473,190 A | * | 12/1995 | Inoue et al. | ............ 257/671 |

(Continued)

FOREIGN PATENT DOCUMENTS

DE    103 24 069 A1    12/2004

(Continued)

OTHER PUBLICATIONS

U.S. Appl. No. 11/489,720, filed Jul. 20, 2006, Hosseini, et al.

*Primary Examiner*—Fernando L Toledo
*Assistant Examiner*—Ankush K Singal
(74) *Attorney, Agent, or Firm*—Edell, Shapiro & Finnan, LLC

(57) ABSTRACT

A semiconductor power component using flat conductor technology includes a vertical current path through a semiconductor power chip. The semiconductor power chip includes at least one large-area electrode on its top side and a large-area electrode on its rear side. The rear side electrode is surface-mounted on a flat conductor chip island of a flat conductor leadframe and the top side electrode is electrically connected to an internal flat conductor of the flat conductor leadframe via a connecting element. The connecting element includes a bonding strip extending from the top side electrode to the internal flat conductor and further includes, on the top side of the bonding strip, bonding wires extending from the top side electrode to the internal flat conductor.

7 Claims, 1 Drawing Sheet

U.S. PATENT DOCUMENTS

| | | | | |
|---|---|---|---|---|
| 5,480,841 A * | 1/1996 | Bickford et al. | ............... | 29/827 |
| 5,491,302 A * | 2/1996 | Distefano et al. | ........... | 174/260 |
| 5,530,282 A * | 6/1996 | Tsuji | .......................... | 257/666 |
| 5,536,909 A * | 7/1996 | DiStefano et al. | ........... | 174/261 |
| 5,544,412 A * | 8/1996 | Romero et al. | ................. | 29/832 |
| 5,751,057 A * | 5/1998 | Palagonia | ................... | 257/691 |
| 5,753,529 A * | 5/1998 | Chang et al. | ................. | 438/118 |
| 5,763,952 A * | 6/1998 | Lynch et al. | ................. | 257/735 |
| 5,783,857 A * | 7/1998 | Ziegner et al. | ............... | 257/664 |
| 5,783,861 A * | 7/1998 | Son | ............................. | 257/694 |
| 5,841,197 A * | 11/1998 | Adamic, Jr. | ................. | 257/777 |
| 6,012,224 A * | 1/2000 | DiStefano et al. | ............. | 29/840 |
| 6,025,640 A * | 2/2000 | Yagi et al. | .................... | 257/666 |
| 6,077,727 A * | 6/2000 | Osawa et al. | ................ | 438/123 |
| 6,191,473 B1 * | 2/2001 | Distefano | ................... | 257/691 |
| 6,215,377 B1 * | 4/2001 | Douriet | ....................... | 333/247 |
| 6,307,272 B1 * | 10/2001 | Takahashi et al. | ........... | 257/787 |
| 6,319,755 B1 * | 11/2001 | Mauri | ........................ | 438/119 |
| 6,370,032 B1 * | 4/2002 | DiStefano et al. | ........... | 361/760 |
| 6,410,983 B1 * | 6/2002 | Moriizumi et al. | ........... | 257/723 |
| 6,465,744 B2 * | 10/2002 | Baker et al. | ................. | 174/260 |
| 6,586,833 B2 * | 7/2003 | Baliga | ........................ | 257/712 |
| 6,667,546 B2 * | 12/2003 | Huang et al. | ................. | 257/691 |
| 6,687,842 B1 * | 2/2004 | DiStefano et al. | ........... | 713/500 |
| 6,703,703 B2 * | 3/2004 | Grant | ......................... | 257/688 |
| 6,747,360 B2 * | 6/2004 | Fukuizumi et al. | .......... | 257/783 |
| 6,756,658 B1 * | 6/2004 | Gillett et al. | ................. | 257/666 |
| 6,774,466 B1 * | 8/2004 | Kajiwara et al. | ............. | 257/673 |
| 6,777,800 B2 * | 8/2004 | Madrid et al. | ................ | 257/690 |
| 6,833,611 B2 * | 12/2004 | Liu et al. | ..................... | 257/678 |
| 6,841,421 B2 | 1/2005 | Aono et al. | | |
| 6,940,184 B2 * | 9/2005 | Ueda et al. | .................. | 257/790 |
| 7,001,799 B1 * | 2/2006 | Edwards et al. | ............. | 438/124 |
| 7,030,501 B2 * | 4/2006 | Yoshiba et al. | .............. | 257/777 |
| 7,042,104 B2 * | 5/2006 | Hong | ........................... | 257/784 |
| 7,057,275 B2 * | 6/2006 | Schwarzbauer et al. | ..... | 257/706 |
| 7,119,421 B2 * | 10/2006 | Rohrmoser et al. | ......... | 257/666 |
| 7,190,062 B1 * | 3/2007 | Sheridan et al. | ............. | 257/686 |
| 7,208,818 B2 * | 4/2007 | Luo et al. | .................... | 257/666 |
| 7,271,481 B2 * | 9/2007 | Khandros et al. | ........... | 257/735 |
| 7,303,113 B2 * | 12/2007 | Kwark et al. | ............. | 228/180.5 |
| 7,417,198 B2 * | 8/2008 | Betz et al. | .................... | 174/536 |
| 7,435,108 B1 * | 10/2008 | Eldridge et al. | ............... | 439/81 |
| 2001/0015490 A1 * | 8/2001 | Lee | ............................. | 257/693 |
| 2001/0045627 A1 * | 11/2001 | Connah et al. | .............. | 257/666 |
| 2002/0025573 A1 * | 2/2002 | Maher et al. | ............... | 435/287.1 |
| 2002/0028480 A1 * | 3/2002 | Maher et al. | ................... | 435/40 |
| 2002/0034069 A1 * | 3/2002 | Worz et al. | ................... | 361/803 |
| 2002/0057610 A1 * | 5/2002 | Baliga | ........................ | 365/200 |
| 2002/0119603 A1 * | 8/2002 | Tani et al. | .................... | 438/123 |
| 2003/0122232 A1 * | 7/2003 | Hirano et al. | ................ | 257/678 |
| 2003/0162330 A1 * | 8/2003 | Aono et al. | ................... | 438/129 |
| 2004/0000702 A1 * | 1/2004 | Knapp et al. | ................. | 257/666 |
| 2004/0048488 A1 * | 3/2004 | Baliga | ........................ | 438/719 |
| 2004/0253496 A1 * | 12/2004 | Foster | ........................... | 429/30 |
| 2005/0048758 A1 * | 3/2005 | Hosseini et al. | ............. | 438/614 |
| 2005/0224945 A1 * | 10/2005 | Saito et al. | ................... | 257/686 |
| 2005/0237722 A1 * | 10/2005 | Hable | ........................... | 361/728 |
| 2005/0269694 A1 * | 12/2005 | Luechinger | ................. | 257/724 |
| 2006/0012032 A1 * | 1/2006 | Paulus et al. | ................. | 257/706 |
| 2006/0038265 A1 * | 2/2006 | Oberlin et al. | ............... | 257/676 |
| 2006/0049505 A1 * | 3/2006 | Wyland | ...................... | 257/690 |
| 2007/0099437 A1 * | 5/2007 | Hable | ........................... | 438/773 |

FOREIGN PATENT DOCUMENTS

| | | |
|---|---|---|
| DE | 10 2004 006 440 A1 | 9/2005 |
| DE | 10 2004 036 905 A1 | 3/2006 |
| EP | 0 776 041 A2 | 5/1997 |
| JP | 60-157238 | 8/1985 |
| JP | 2002-208673 | 7/2002 |
| JP | 2003-229527 | 8/2003 |
| WO | WO 2004/100258 A2 | 11/2004 |

* cited by examiner

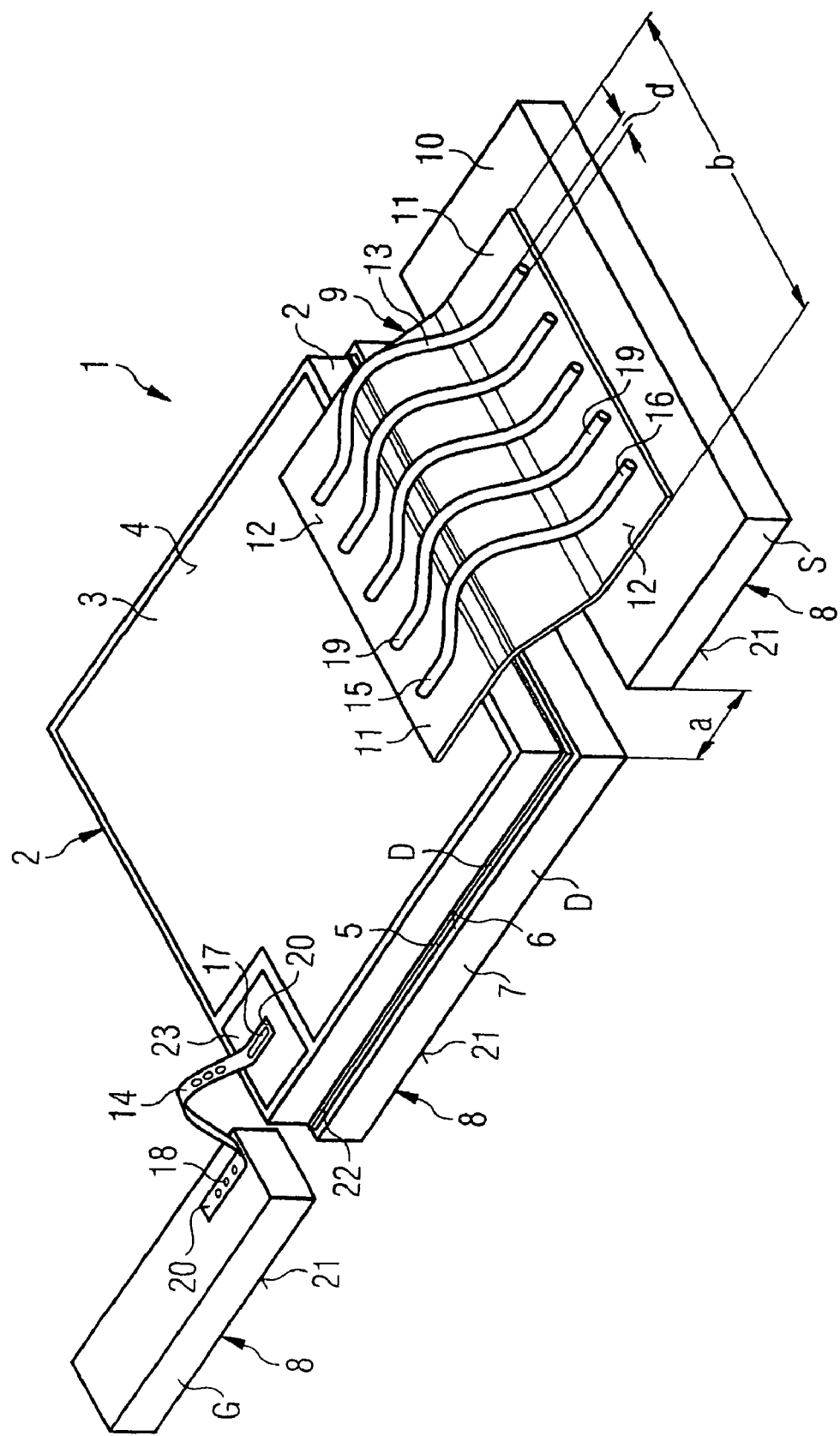

SEMICONDUCTOR POWER COMPONENT WITH A VERTICAL CURRENT PATH THROUGH A SEMICONDUCTOR POWER CHIP

CROSS REFERENCE TO RELATED APPLICATIONS

This application claims priority under 35 USC §119 to German Application No. DE 10 2005 039 165.6, filed on Aug. 17, 2005, and titled "Semiconductor Power Component with a Vertical Current Path through a Semiconductor Power Chip, and Method for Producing It," the entire contents of which are hereby incorporated by reference.

FIELD OF THE INVENTION

The invention relates to a semiconductor power component using flat conductor technology with a vertical current path through a semiconductor power chip.

BACKGROUND

In flat conductor technologies, the rear side electrode of the semiconductor power chip can be surface-mounted on a flat conductor chip island of a flat conductor leadframe. The top side electrode is electrically connected to an internal flat conductor of the flat conductor leadframe via a connecting line or a connecting element.

A semiconductor power component of this type is known from U.S. Patent Application Publication No. 2003/0162330. In the case of the known semiconductor power component having a semiconductor power chip, however, there is no large-area electrode provided on the top side of the semiconductor power chip, rather this large-area electrode is divided into contact strips. The contact strips of the surface electrode are connected via bonding wires to a busbar, which is arranged on an insulated base and merges into an external flat conductor. The large-area rear side electrode is fixed directly on a chip island of a flat conductor leadframe and is electrically connected to a further external flat conductor.

One disadvantage of the semiconductor power component is that the surface electrode is split into narrow strips which, for their part, merge into bonding wires. This has the disadvantage that the permissible current density is limited by the sum of the cross sections of the bonding wires. Consequently, the current has to be limited depending on the diameters of the bonding wires in order to prevent the bonding wires of the semiconductor power component from being fused.

German Patent document number DE 10 2004 006 440.7 discloses a sensor component having a freely accessible sensor region, the sensor region of which is ensured with corresponding contact pads on a substrate via connecting lines, where the connecting lines may be either bonding tapes, bonding wires or flat cables. In order to transfer this solution to a semiconductor power component, the cross sections of the bonding tapes have to be enlarged in such a way that a reliable bonding connection cannot be ensured on account of the thickness of the bonding tapes then required.

If a plurality of bonding wires are used for the semiconductor power component, they limit the maximum possible current or the maximum possible current density through the semiconductor power component, as is already known from U.S. Patent Application Publication No. 2003/0162330. Finally, there are also solutions in which flat cables connect the large-area electrode to corresponding wide contact pads of an internal flat conductor. However, with these relatively flat cables, there is also the problem of producing a reliable cohesive connection to the large-area top side electrode of the semiconductor chip.

SUMMARY OF THE INVENTION

The present invention provides current routing through a semiconductor power chip with a vertical current path, so that a higher current density is permissible. Further, the present invention overcomes the disadvantages in the the conventional semiconductor power chip art and provides a connecting element which, without any risks, enables even high power currents from a large-area top side electrode to corresponding contact pads on a wiring substrate.

In accordance with the present invention, a semiconductor power component is provided using flat conductor technology with a vertical current path through a semiconductor power chip. The semiconductor power chip comprises at least one large-area electrode on its top side and a large-area electrode on its rear side. A vertical current path is formed between the rear side electrode and the top side electrode during operation of the semiconductor power component. In this respect, the rear side electrode is surface-mounted on a flat conductor chip island of a circuit carrier and the top side electrode is connected to an internal flat conductor of a flat conductor leadframe via a connecting element. Not only does the connecting element have a bonding strip extending from the top side electrode to an internal flat conductor, but bonding wires from the top side electrode to the internal flat conductor are additionally arranged on the top side of the bonding strip.

The above and still further features and advantages of the present invention will become apparent upon consideration of the following detailed description of specific embodiments thereof, particularly when taken in conjunction with the accompanying drawing.

BRIEF DESCRIPTION OF THE DRAWINGS

FIG. 1 is a perspective view of a semiconductor power component 1 in accordance with one embodiment of the invention.

DETAILED DESCRIPTION

A semiconductor power component is provided in accordance with the present invention using flat conductor technology with a vertical current path through a semiconductor power chip. The semiconductor power chip comprises at least one large-area electrode on its top side and a large-area electrode on its rear side. A vertical current path is formed between the rear side electrode and the top side electrode during operation of the semiconductor power component. In this respect, the rear side electrode is surface-mounted on a flat conductor chip island of a circuit carrier and the top side electrode is connected to an internal flat conductor of a flat conductor leadframe via a connecting element. Not only does the connecting element have a bonding strip extending from the top side electrode to an internal flat conductor, but bonding wires from the top side electrode to the internal flat conductor are additionally arranged on the top side of the bonding strip.

The semiconductor power component of the invention provides a number of advantages including, without limitation, that the current density is not limited by the cross section of the bonding wires, nor is it defined by the cross section of a bonding strip, but rather by a connecting element that couples both types of connecting elements to one another and thus makes available a higher-performance current path between the semiconductor chip and an internal flat conductor leading outward.

This semiconductor power component further can be loaded with significantly higher current peaks than previously known semiconductor power components with the same or similar technology.

In a further preferred embodiment of the invention, the bonding wires include bonding wedges at the bonding locations, instead of thermocompression heads. The bonding wedges can bear flat on the top side of the bonding strip, so that the bonding wire can follow the contour of the bonding strip. As a result of closely bearing against the contour of the bonding tape, at the same time this advantageously avoids the formation of induction loops and the coupling in of induction currents.

In a further preferred embodiment of the invention, the bonding wires have a bonding wire diameter d within the range of $0.1\ mm \leq d \leq 0.5\ mm$. Bonding wires having such a thickness for semiconductor power components are preferably produced from aluminum or aluminum alloys and have a thin gold coating at least in part to protect against formation of aluminum oxide.

The thin gold coating supports the thermosonic bonding of the bonding wires on top sides of bonding tapes which are likewise produced from aluminum or an aluminum alloy, since a eutectic alloy having a low melting point can form from aluminum and gold. If the bonding tapes are made of copper, then they are often gold-plated in order then to be reinforced to form a connecting element according to the invention with the aid of bonding wires made of aluminum. In this case, too, the eutectic alloying between the bonding wedge made of aluminum and the gold coating of the copper tape is then advantageously utilized to ensure reliable thermosonic bonding.

In a further preferred embodiment of the invention, the width of the bonding strip or the bonding tape is adapted to the width of the top side electrode. The width of the bonding strip is thus slightly smaller than the width of the top side electrode. The same applies conversely to the adaptation of the bonding strip to the width of the internal flat conductor. If the width of the internal flat conductor is less than the width of the top side electrode, then it is possible to reduce the width of the bonding strip from the top side electrode to the internal flat conductor in such a way that the bonding strip is only slightly narrower than the width of the top side electrode and is likewise only slightly narrower than the width of the internal flat conductor, even though the widths of internal flat conductor and top side electrode may differ considerably.

In a further preferred embodiment of the invention, an electrically conductive connecting layer is arranged between the top side electrode and the bonding strip. This is advantageous when the bonding strip attains a thickness which, with normal bonding styluses, cannot lead to a formation of eutectic melts. In this embodiment, an electrically conductive connecting layer, preferably made of a double-sided adhesive and electrically conductive film, is arranged between the top side electrode and the bonding strip in order to enable an ohmic contact on the entire width of the bonding strip. In this embodiment, it is advantageous to arrange such an electrically conductive connecting layer between the internal flat conductor and the bonding strip, thus enabling the bonding strip to be applied to both connection areas, namely on the top side electrode and the internal flat conductor, via a single method step.

The connecting elements according to the invention comprising bonding strips and bonding wires are preferably used for semiconductor power components which are known by the collective term compensation semiconductor power components, such as, for example, semiconductor power diodes with a cathode as rear side electrode and an anode as top side electrode, or as in the case of a so-called "CoolMos" having a large-area drain electrode on its rear side and a large-area external electrode on its top side, between which electrodes the current path is formed as soon as a corresponding switching potential is applied to the relatively small-area gate electrode located at the top side. Furthermore, semiconductor power components such as IGBT or PIN diodes can be equipped with the connecting elements according to the invention, in which case firstly the conduction resistance, also called "package resistance", is reduced and secondly the risk of the connecting elements overheating is reduced.

A method for producing a plurality of semiconductor power components using flat conductor technology with a vertical current path through a semiconductor power chip in accordance with the invention includes the following method steps. The first step includes producing semiconductor power chips with a large-area top side electrode and a large-area rear side electrode, the areal extent of the rear side electrode corresponding to the size of the rear side. In addition, a flat conductor is made available including a flat conductor chip island and at least one internal flat conductor spaced apart from the flat conductor island in a plurality of semiconductor power component positions of the flat conductor leadframe. The semiconductor power chips can then be applied to the flat conductor leadframe in the semiconductor power component positions with cohesive connection of the rear side electrodes to the flat conductor chip islands of the flat conductor leadframe.

Afterward, a bonding strip is cohesively connected, the width of which is adapted to the width of the top side electrode, so that the top side electrode is connected to the internal flat conductor in the semiconductor power component positions via the bonding strip. The bonding strip is then enlarged in its cross section to form a connecting element according to the invention by application of additional bonding wires to the top side of the bonding strip in each of the semiconductor power component positions. The semiconductor power chips with the connecting elements can then be packaged in a plastic housing composition in the semiconductor power component positions and, finally, the flat conductor leadframe can then be separated into individual semiconductor power components.

The method according to the invention facilitates the simultaneous production of a plurality of semiconductor power components using flat conductor technology. Furthermore, the method provides semiconductor power components which have a vertical current path enabling an improved, higher permissible current density.

To summarize, the invention enables an improvement of the current-carrying capacity of semiconductor power components by a combination of bonding strips and bonding wires. The available space above the bonding strips is utilized in order to fit on the bonding strips further bonding wires with corresponding flat bonding wedges in the bonding positions on the semiconductor chip and on the corresponding flat conductors of the flat conductor leadframe. With these connecting elements according to the invention, at the same time a homogeneous current density distribution for the semiconductor power chip is achieved and an improved dissipation of heat is ensured.

Consequently, the heart of the invention resides in the use of bonding wires which are applied on the bonding strips via a bonding wedge technique. After the application of semiconductor power chips with corresponding bonding strips, aluminum wires having a diameter of 0.05 mm to 0.6 mm in the bonding wedge technology can be positioned on the bonding strips by corresponding bonding. It is thus possible to obtain, by way of example, a reduction of the housing-specific resistance of up to 50%.

An exemplary embodiment of the invention is now described with reference to FIG. 1.

In order to better elucidate the construction of the semiconductor power component 1 in accordance with one embodiment of the invention, a plastic housing composition into which the individual components are packaged has been omitted in FIG. 1. The plastic housing composition can be any conventional or other suitable composition used to package the semiconductor components.

The semiconductor power component 1 using flat conductor technology is constructed on a flat conductor leadframe 8, three components of which are represented in FIG. 1. These three components include a gate connection flat conductor G, a source connection flat conductor S and, spaced apart therefrom, a flat conductor chip island 7 for the drain connection D. The flat conductor chip island 7 carries a semiconductor power chip 2, which, with its rear side 6, includes a large-area electrode 5 as drain electrode D and is fixed on the flat conductor chip island 7. This fixing can be achieved, e.g., via an electrically conductive double-sided adhesive film 22 or via some other cohesive connection, such as a solder connection.

A large-area electrode 3 formed as a source electrode is likewise arranged on the top side 4 of the semiconductor power chip 2. During operation of the semiconductor power component 1 as a field effect transistor, a vertical current path is formed between the rear side electrode 5 and the top side electrode 3. This activation is controlled by a smaller electrode 23 on the top side 4 of the semiconductor power chip 2. The smaller electrode 23 is connected via a gate bonding wire 14 with the wedge-shaped bonding locations 17 and 18 to the gate connection flat conductor G via gate bonding wedges 20, so that the small electrode 23 can be supplied with a circuit potential from outside the semiconductor power component 1. The flat conductor chip islands 7 may both serve as drain external contacts D and be connected to a drain external contact flat conductor (not shown). Furthermore, the flat conductor chip islands 7 can be formed as a heat sink for the semiconductor power chip 2 and form the underside 21 of the semiconductor component. In order to surmount the distance a between the top side 4 of the semiconductor power chip 2 and the source connection flat conductor S, a connecting element 9 is arranged between the top side 4 of the large-area electrode 3 situated thereon and the internal flat conductor 10 of the flat conductor leadframe 8.

The connecting element 9 comprises a combination of a bonding strip 11 and a plurality of bonding wires 13 which are fixed on the top side 12 of the bonding strip 11 via bonding wedges 19 with the bonding locations 15 and 16. The flat bonding wedges 19 minimize the space requirement in the plastic housing composition (not shown), and at the same time the bonding wires 13 significantly enlarge the cross section of the bonding strip 11. It is thus possible to pass a higher current density via the current path from the source connection flat conductor S via the semiconductor power chip 2 to the drain connection contact D. For this purpose, the width b of the bonding strip 11 is adapted both to the internal flat conductor 10 of the source connection flat conductor S and to the width b of the top side electrode 3. The diameter d of the bonding wires 13 is designed such that a plurality of bonding wires 13 can be arranged alongside one another and parallel to one another on the top side 12 of the bonding strip 11. For this purpose, the diameter d of the bonding wires 13 lies within the range of $0.05$ mm$\leq$d$\leq$0.6 mm.

Even though the bonding strip 11 is formed with a constant width b in FIG. 1, the width b of the internal flat conductor 10 can nevertheless be reduced or enlarged in order to optimally adapt the width b of the bonding strip both to the size of the top side electrode 3 and to the width b of the internal flat conductor 10.

List of Reference Symbols

1 Semiconductor power component
2 Semiconductor power chip
3 Large-area electrode on the top side of the semiconductor power chip
4 Top side of the semiconductor power chip
5 Large-area electrode on the rear side of the semiconductor power chip
6 Rear side of the semiconductor power chip
7 Flat conductor chip island
8 Flat conductor leadframe
9 Connecting element
10 Internal flat conductor
11 Bonding strip
12 Top side of the bonding strip
13 Bonding wire
14 Gate bonding wire
15 Bonding location
16 Bonding location
17 Bonding location
18 Bonding location
19 Bonding wedge
20 Gate bonding wedge
21 Underside of the semiconductor component
22 Electrically conductive double-sided adhesive film
23 Small electrode on the top side of the semiconductor power chip
a Distance
b Width of the bonding strip
d Bonding wire diameter
D Drain external contact
G Gate connection flat conductor
S Source connection flat conductor

What is claimed:

1. A semiconductor power component that uses flat conductor technology, the semiconductor power component comprising:

a semiconductor power chip comprising at least one large-area top side electrode disposed on a top side of the chip and a large-area rear side electrode disposed adjacent a rear side of the chip and mounted on a flat conductor chip island of a flat conductor leadframe, wherein a vertical current path is formed through the chip between the rear side electrode and the top side electrode; and an internal flat conductor of the flat conductor leadframe connected to the top side electrode via a connecting element, wherein the connecting element comprises a bonding strip extending from the top side electrode to the internal flat conductor and bonding wires extending from the top side electrode to the internal flat conductor and being arranged along a top side of the bonding strip.

2. The semiconductor power component of claim 1, wherein the bonding wires include bonding wedges at bonding locations that connect the top side electrode to the internal flat conductor.

3. The semiconductor power component of claim 1, wherein at least one bonding wire has a bonding wire diameter within from 0.1 mm to 0.5 mm.

4. The semiconductor power component of claim 1, wherein the bonding strip has a width that is no greater than a width of the top side electrode.

5. The semiconductor power component of claim 1, wherein the bonding strip has a width that is no greater than a width of the internal flat conductor.

6. The semiconductor power component of claim 1, wherein an electrically conductive connecting layer is disposed between the top side electrode and the bonding strip.

7. The semiconductor power component of claim 1, wherein an electrically conductive double-sided adhesive film is disposed between the top side electrode and the bonding strip.

* * * * *